United States Patent
Street et al.

(10) Patent No.: US 8,673,750 B2
(45) Date of Patent: Mar. 18, 2014

(54) SINGLE CRYSTAL SILICON TFTS MADE BY LATERAL CRYSTALLIZATION FROM A NANOWIRE SEED

(75) Inventors: Robert A. Street, Palo Alto, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 253 days.

(21) Appl. No.: 13/330,516

(22) Filed: Dec. 19, 2011

(65) Prior Publication Data
US 2013/0157447 A1    Jun. 20, 2013

(51) Int. Cl.
*H01L 21/20*    (2006.01)
*H01L 21/36*    (2006.01)
*H01L 31/20*    (2006.01)

(52) U.S. Cl.
USPC ....... 438/483; 438/486; 257/E21.09; 977/762

(58) Field of Classification Search
USPC ........... 438/483–486; 977/700–762, 890–948
See application file for complete search history.

(56) References Cited

U.S. PATENT DOCUMENTS

2011/0189510 A1* 8/2011 Caracciolo et al. ............. 429/50
2011/0240954 A1* 10/2011 Park et al. ......................... 257/9

OTHER PUBLICATIONS

A Novel Fabrication Technique for Developing Metal Nanodroplet Arrays Christopher Edgar, Chad Johns, and M. Saif Islam Electrical and Computer Engineering, University of California, Davis. Mater. Res. Soc. Symp. Proc. vol. 940 © 2006 Materials Research Society.*

* cited by examiner

*Primary Examiner* — Charles Garber
*Assistant Examiner* — Abdulfattah Mustapha
(74) *Attorney, Agent, or Firm* — Marger Johnson & McCollom PC

(57) ABSTRACT

A method can include depositing a thin metal film on a substrate of a sample, establishing a metal island on the substrate by patterning the thin metal film, and annealing the sample to de-wet the metal island and form a metal droplet from the metal island. The method can also include growing a nanowire on the substrate using the metal droplet as a catalyst, depositing a thin film of a semiconductor material on the sample, annealing the sample to allow for lateral crystallization to form a crystal grain, and patterning the crystal grain to establish a crystal island. An electronic device can be fabricated using the crystal island.

24 Claims, 9 Drawing Sheets

SINGLE CRYSTAL SILICON TFTS MADE BY LATERAL CRYSTALLIZATION FROM A NANOWIRE SEED

TECHNICAL FIELD

The disclosed technology relates to the field of semiconductor processing and, more particularly, to various techniques pertaining to the use of nanowire growth and lateral crystallization in forming semiconductor components and devices.

BACKGROUND

Large area polycrystalline thin-film transistors (TFTs) are often used for high performance backplanes such as, for example, for organic light-emitting diode (OLED) displays, displays with integrated control electronics, next-generation medical imaging devices, and various other types of advanced array electronics. Large area polycrystalline TFTs are usually fabricated by laser recrystallization in low temperature polysilicon (LTPS) processing. While LTPS processing may produce good performance TFTs having a mobility of approximately 100 $cm^2$/V-s, LTPS processing leads to significant threshold voltage non-uniformity.

Among the number of problems and shortcomings associated with current LTPS processing is that the laser tool used in such processing is widely considered to be problematic in manufacturing practices. Even more concerning is that the polycrystalline structure resulting from such processing generally leads to threshold voltage non-uniformity, as noted above, and other performance variations, largely because each device has a small and widely varying number of crystalline grains.

During recent years, there have been several attempts to make large area devices comprising single crystal islands, but none have succeeded commercially. For example, some of the techniques that are currently in development have the problem of fabricating a sub-micron seed layer, which is too small for large area lithography. Indeed, there are currently no readily available manufacturing methods for making large area arrays of single crystal islands positioned at predetermined locations.

Accordingly, there remains a need for improved processing of semiconductor components and devices, particularly with regard to single crystal TFTs.

DETAILED DESCRIPTION

Single crystal silicon components, such as TFTs, tend to have significantly better performance than polycrystalline silicon components. Indeed, various performance issues of a number of types of silicon components can be readily solved by making such silicon components from single crystals.

Certain embodiments of the disclosed technology include making a single crystal silicon seed using techniques that are used to grow silicon nanowires and then perform lateral crystallization of a thin amorphous silicon film to form a silicon island. Islands of single crystal silicon can be grown on glass from a single crystal seed by lateral crystallization at an elevated temperature. In certain embodiments, a single crystal seed may be located at a specific position where a silicon component, such as a TFT, is desired.

Certain embodiments of the disclosed technology include methods for making single crystal silicon islands on a substrate such as glass. For example, a single crystal seed may be fabricated as a silicon nanowire that is grown from a lithography-defined catalyst and then coated with amorphous silicon. Lateral crystallization may be used to form multiple single crystal islands at pre-determined locations. Because a typical polysilicon TFT in a backplane has a channel length of 3-10 microns and a width of 5-20 microns, a single crystal island need not be any larger than 30 microns by 30 microns and may be as small as 3 microns by 5 microns or even smaller.

In certain embodiments, vapor-liquid-solid (VLS) techniques are employed to grow a nanowire for making a single crystal seed for lateral crystallization of a thin film. Lateral crystallization of the thin film from the single crystal seed may be formed by patterning a catalyst, such as a small gold nanoparticle, for growing the nanowire. The catalyst may have a size of approximately 20 nanometers to 300 nanometers. Such a small size generally cannot be patterned by large area lithography.

Figure 1:
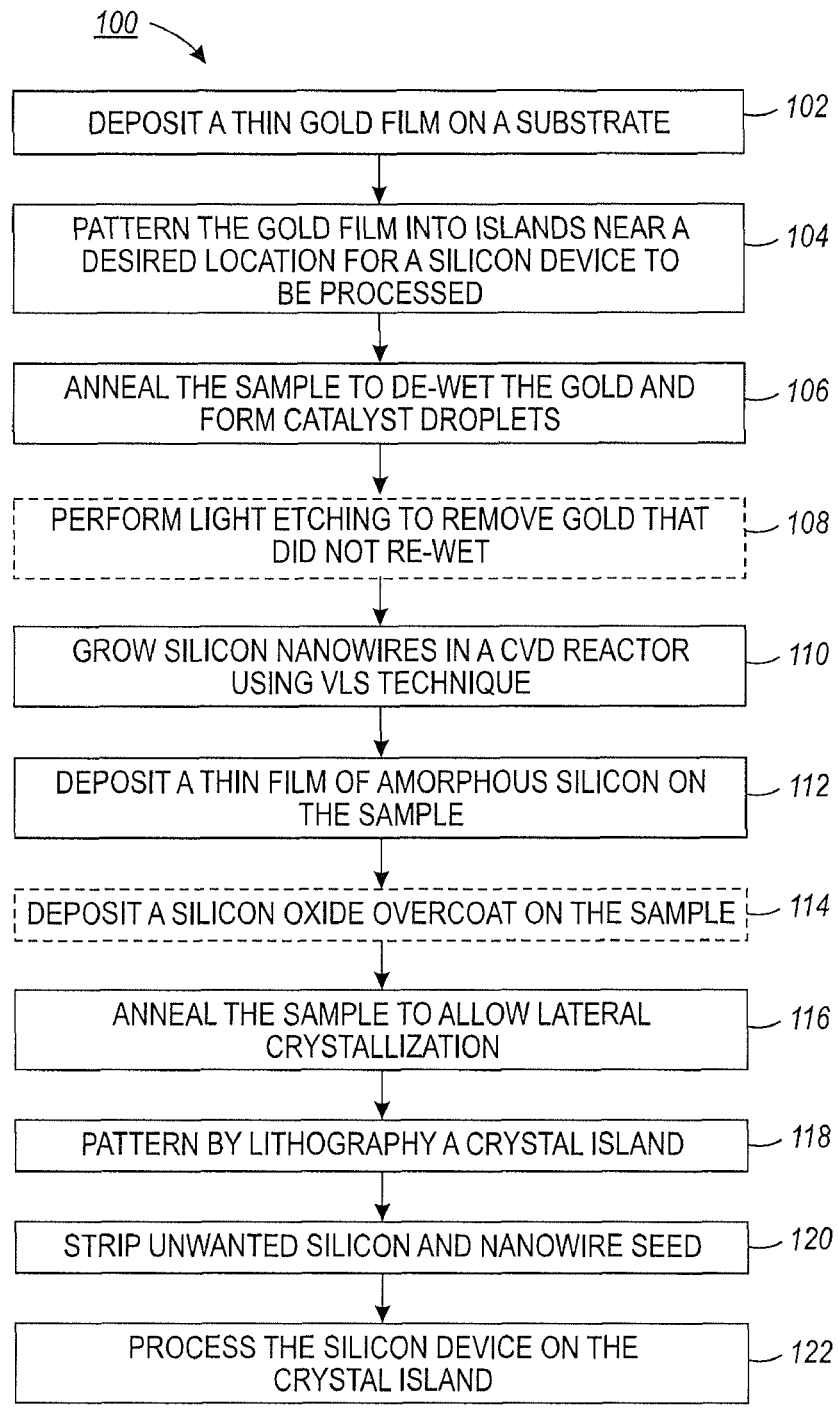
FIG. 1 illustrates a first example of a method for making a single crystal silicon island suitable for use in processing a silicon device such as a TFT in accordance with certain embodiments of the disclosed technology.

FIG. 1 illustrates a first example of a method 100 for making a single crystal silicon island suitable for use in processing a silicon device such as a TFT. At 102, a thin gold film is deposited on a substrate. The gold film may have a thickness of approximately 5 nanometers, for example. The gold film may be deposited on the substrate by way of conventional sputtering or evaporation techniques, for example. It should be noted that, while the example illustrated by FIG. 1 specifies a thin gold film, virtually any other suitable metal may be used for the thin film, such as copper or nickel, for example.

At 104, the thin gold film is patterned into minimum size gold islands that are each located near (e.g., within a few microns of) a desired location for the forming of a silicon device or component such as a TFT. Patterning of the thin gold film may be accomplished by way of standard large area lithography techniques, for example. The resulting gold islands may each have a feature size of 1-2 microns, which is often the minimum size that can be handled by standard large area lithography techniques.

At 106, the sample is annealed to de-wet the gold, resulting in the formation of catalyst droplets that are typically an order of magnitude smaller in area than the original film and suitable for use as a catalyst for nanowire growth. These catalyst droplets may have a diameter of 200 nanometers or less, for example. In certain embodiments, other metal nanowire catalysts may be used in place of or in addition to gold droplets, such as copper or nickel, for example.

A light etching may be optionally performed to remove any of the gold that did not de-wet at 106, as indicated at 108.

At 110, single silicon nanowires are grown in a chemical vapor deposition (CVD) reactor using vapor-liquid-solid (VLS) or vapor-solid-solid (VSS) techniques. Growth of the single nanowires is typically done at 400-450 degrees Celsius using silane (SiH4) or SiCl4. The nanowires need only be grown tall enough to develop a single crystal structure. In certain embodiments, each nanowire will have a diameter of approximately 200 nanometers or less. Nanowires can generally be made from any of germanium, several III-V semiconductors, and various oxides. Other materials that can be grown as nanowires from a catalyst may be used in place of or in addition to the noted materials.

After the nanowire growth, the remaining gold catalyst may be optionally removed by etching, either before or after the formation of the silicon island.

At 112, a thin film of amorphous silicon is deposited on the sample. This deposition may be accomplished by any of a number of common techniques such as PECVD, sputtering, or evaporation. If PECVD amorphous silicon is used, part of the thermal cycling for the crystallization will be to de-hydrogenate the thin film, which typically involves a slow ramp-up in temperature. In certain embodiments, the thickness of the thin film of amorphous silicon deposited on the substrate is approximately 100 nanometers.

At 114, a silicon oxide overcoat or other type of suitable overcoat may be optionally deposited on the sample before lateral crystallization.

At 116, the sample is annealed to allow for lateral crystallization from the single crystal seed. In certain embodiments, crystallization of the amorphous silicon will result in single crystal grains that are several microns in size. Certain embodiments may include heterogeneous lateral crystallization in which a single crystal seed and the corresponding island material are different.

In certain embodiments, the crystallization temperature is approximately 500 degrees Celsius. Any of a number of parameters may be adjusted to optimize the lateral crystallization at 116. Such parameters may include, but are not limited to, the annealing temperature and time, use of a temperature ramp, and whether the annealing is done in a vacuum or with hydrogen or other ambient.

At 118, any of a number of single crystal islands of selected size and location are patterned by lithography. At 120, unwanted silicon material and the nanowire seed may be stripped.

At 122, a silicon component or device, such as a TFT, may be processed on a crystal island resulting from 118. Such processing may be performed by way of conventional silicon device processing techniques. Indeed, virtually any silicon device or component can be fabricated on a single crystal island. Such devices and components can include, but art not limited to, diodes, photodiodes, random-access memory (RAM), and floating gate transistors. In certain embodiments, complete circuits can be formed on a single crystal island.

The crystalline island may be fabricated with materials other than silicon and with a nanowire seed that is other than silicon. For example, the nanowire and island can include gallium nitride (GaN), gallium arsenide (GaAs), any other III-V semiconductor, or any other semiconductor that can be grown as a nanowire and crystallized into an island. In addition, the nanowire material and the crystalline island may be different provided that the nanowire acts as a seed for the growth of a single crystal island material. Using materials other than silicon may provide for optimized electronic devices. For example, GaN can be used to make a light emitting diode in the blue, green, and UV region of the spectrum—something that cannot be accomplished with silicon.

Figure 2:
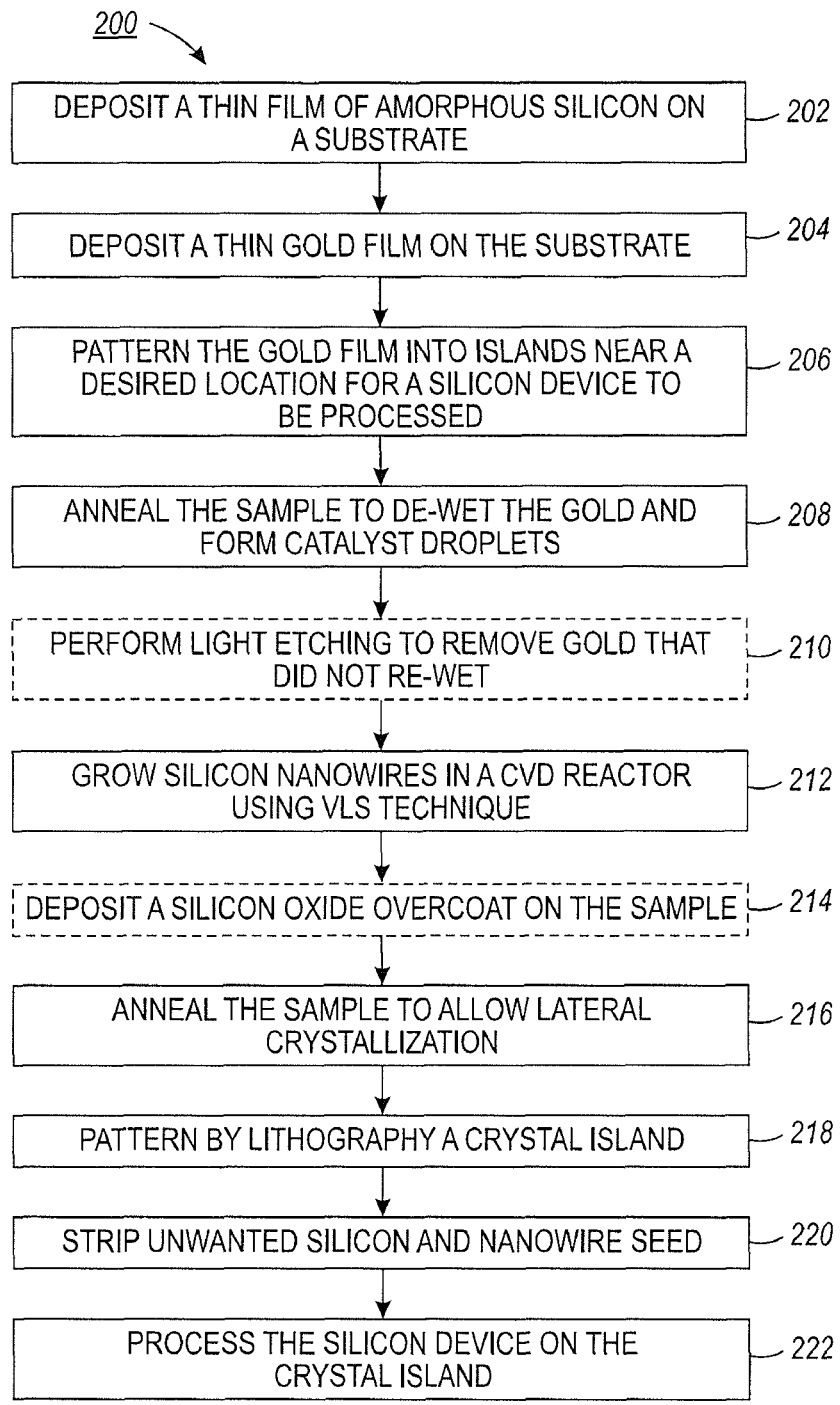
FIG. 2 illustrates a second example of a method for making a single crystal silicon island suitable for use in processing a silicon device such as a TFT in accordance with certain embodiments of the disclosed technology.

FIG. 2 illustrates a second example of a method 200 for making a single crystal silicon island suitable for use in processing a silicon device such as a TFT in accordance with certain embodiments of the disclosed technology. At 202, a thin film of amorphous silicon, e.g., 100 nanometers, is deposited on a substrate. This deposition may be accomplished by any of a number of common techniques such as PECVD, sputtering, or evaporation.

At 204, a thin gold film is deposited on the substrate. At 206, the thin gold film is patterned into minimum size gold islands that are each located near a desired location for the forming of a silicon device or component. At 208, the substrate is annealed to de-wet the gold, resulting in the formation of catalyst droplets. The steps at 204-208 of FIG. 2 are substantially identical to the steps at 102-106, respectively, of FIG. 1.

At 210, a light etching may be optionally performed to remove any of the gold that did not de-wet at 208.

At 212, single silicon nanowires are grown in a CVD reactor using vapor-liquid-solid (VLS) techniques. The step at 212 is substantially identical to the step at 110 of FIG. 1. At 214, a silicon oxide overcoat or other type of suitable overcoat may be optionally deposited on the sample.

After the nanowire growth, the remaining gold catalyst may be optionally removed by etching, either before or after the formation of the silicon island.

At 216, the sample is annealed to allow for lateral crystallization from a single crystal seed. At 218, any of a number of single crystal islands are patterned. At 220, unwanted silicon material and the nanowire seed may be stripped. At 222, a silicon component or device may be fabricated on a single crystal island. The steps at 216-222 of FIG. 2 are substantially identical to the steps at 116-122, respectively, of FIG. 1.

Figure 3:
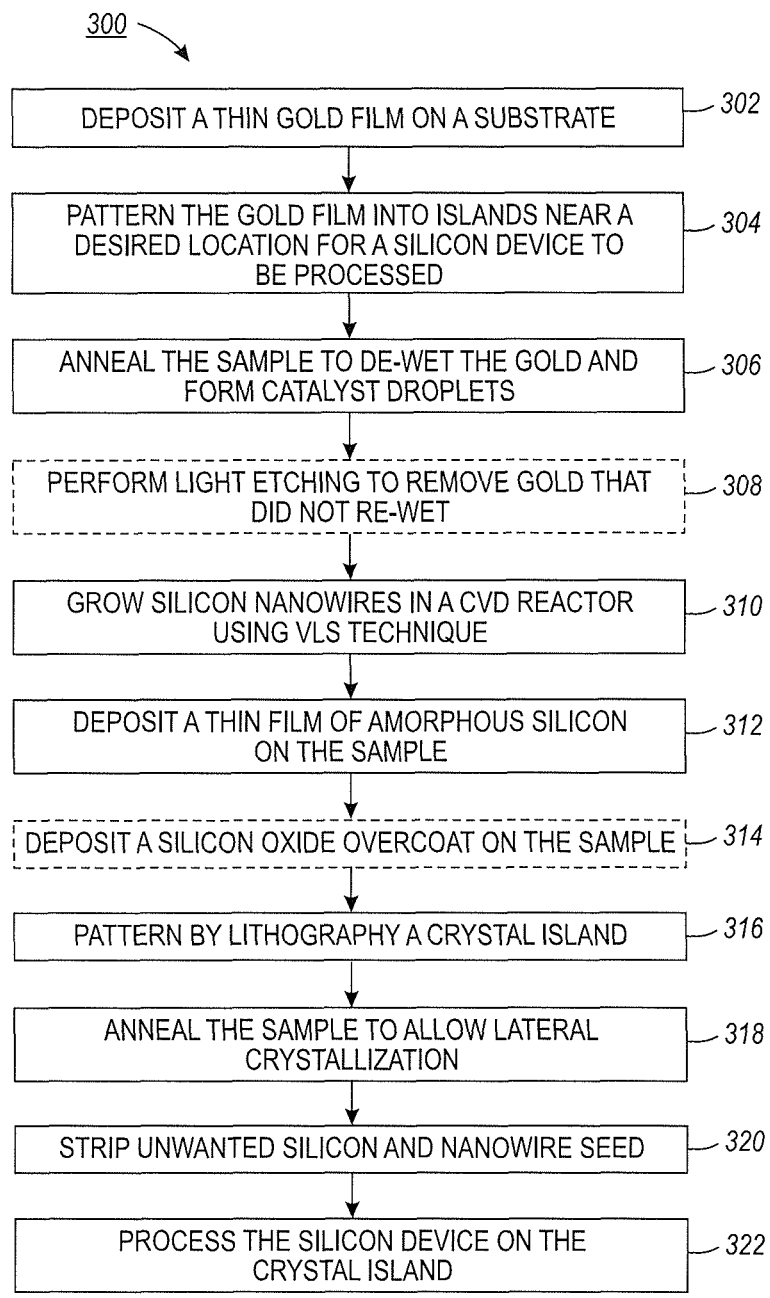
FIG. 3 illustrates a third example of a method for making a single crystal silicon island suitable for use in processing a silicon device such as a TFT in accordance with certain embodiments of the disclosed technology.

FIG. 3 illustrates a third example of a method 300 for making a single crystal silicon island suitable for use in processing a silicon device such as a TFT in accordance with certain embodiments of the disclosed technology.

At 302, a thin gold film is deposited on the substrate. At 304, the thin gold film is patterned into minimum size gold islands that are each located near a desired location for the forming of a silicon device or component. At 306, the substrate is annealed to de-wet the gold, resulting in the formation of catalyst droplets. The steps at 302-306 of FIG. 3 are substantially identical to the steps at 102-106, respectively, of FIG. 1.

At 308, a light etching may be optionally performed to remove any of the gold that did not de-wet at 306.

At 310, single silicon nanowires are grown in a CVD reactor using vapor-liquid-solid (VLS) techniques. The step at 310 is substantially identical to the step at 110 of FIG. 1. At 314, a silicon oxide overcoat or other type of suitable overcoat may be optionally deposited on the sample.

After the nanowire growth, the remaining gold catalyst may be optionally removed by etching, either before or after the formation of the silicon island.

At 312, a thin film of amorphous silicon, e.g., 100 nanometers, is deposited on the sample. This deposition may be accomplished by any of a number of common techniques such as PECVD, sputtering, or evaporation.

At 316, any of a number of single crystal islands are patterned. The step at 316 of FIG. 3 is substantially identical to the step at 118 of FIG. 1. At 318, the sample is annealed to allow for lateral crystallization from a single crystal seed. The step at 318 of FIG. 3 is substantially identical to the step at 116 of FIG. 1. It will be appreciated that patterning the amorphous silicon film (at 316) before allowing for the lateral crystallization (at 318) may help to suppress inhomogeneous crystallization.

At 320, unwanted silicon material and the nanowire seed may be stripped. At 322, a silicon component or device may be fabricated on a single crystal island. The steps at 320 and 322 of FIG. 3 are substantially identical to the steps at 120 and 122, respectively, of FIG. 1.

Figure 4:
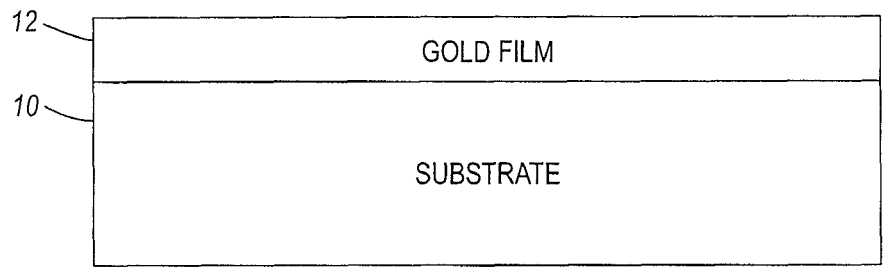
FIG. 4 illustrates a cross-sectional view of a substrate on which a thin gold film is deposited in accordance with certain embodiments of the disclosed technology.

FIG. 4 illustrates a cross-sectional view of a substrate 10 on which a thin gold film 12 is deposited in accordance with certain embodiments of the disclosed technology. The sample illustrated in FIG. 4 may correspond to a sample resulting from the step at 102 of FIG. 1, for example. It should be noted that, while the example specifies a thin gold film, virtually any other suitable metal may be used for the thin film, such as copper or nickel, for example.

Figure 5A:
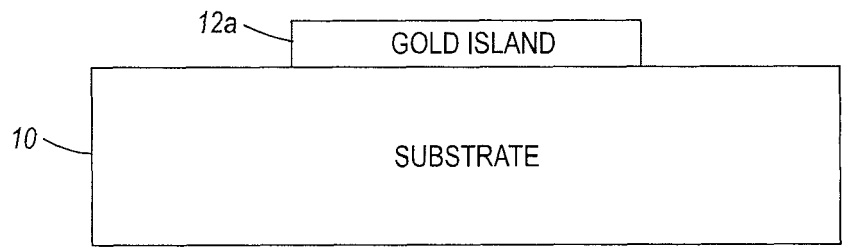
FIG. 5A illustrates a cross-sectional view of a gold island on the substrate resulting from patterning of the gold film on the substrate as shown in FIG. 4.
Figure 5B:
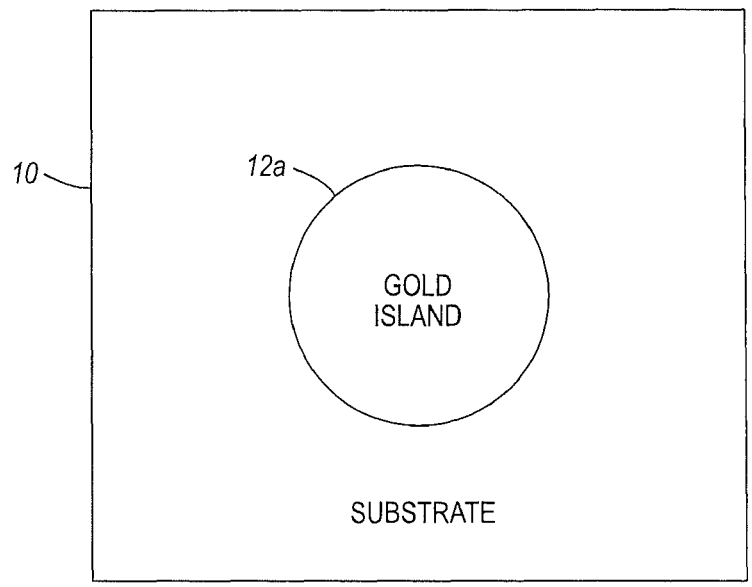
FIG. 5B illustrates a topside view of the gold island on the substrate in accordance with certain embodiments of the disclosed technology.

FIG. 5A illustrates a cross-sectional view of a gold island 12*a* on the substrate 10 resulting from patterning of the gold film 12 on the substrate 10 as shown in FIG. 4 in accordance with certain embodiments of the disclosed technology. FIG. 5B illustrates a topside view of the gold island 12*a* on the substrate 10. The sample illustrated in FIGS. 5A and 5B may correspond to a sample resulting from the step at 104 of FIG. 1, for example.

Figure 6A:
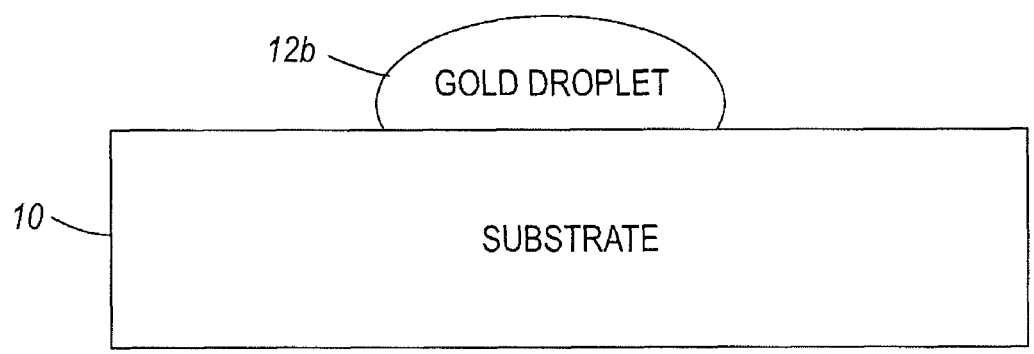
FIG. 6A illustrated a cross-sectional view of a gold droplet on the substrate resulting from annealing of the substrate and de-wetting of the gold island as shown in FIG. 5A.
Figure 6B:
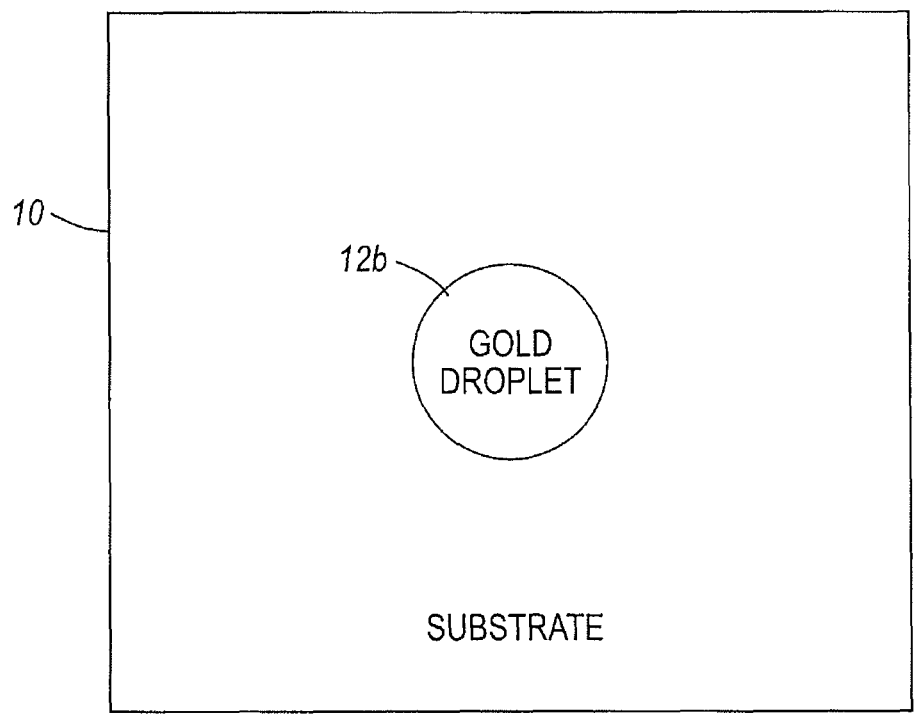
FIG. 6B illustrates a topside view of the gold droplet on the substrate in accordance with certain embodiments of the disclosed technology.

FIG. 6A illustrated a cross-sectional view of a gold droplet 12*b* on the substrate 10 resulting from annealing of the substrate 10 and de-wetting of the gold island 12*a* as shown in FIG. 5A in accordance with certain embodiments of the disclosed technology. FIG. 6B illustrates a topside view of the gold droplet 12*b* on the substrate 10. The sample illustrated in FIGS. 6A and 6B may correspond to a sample resulting from the step at 106 of FIG. 1, for example.

Figure 7A:
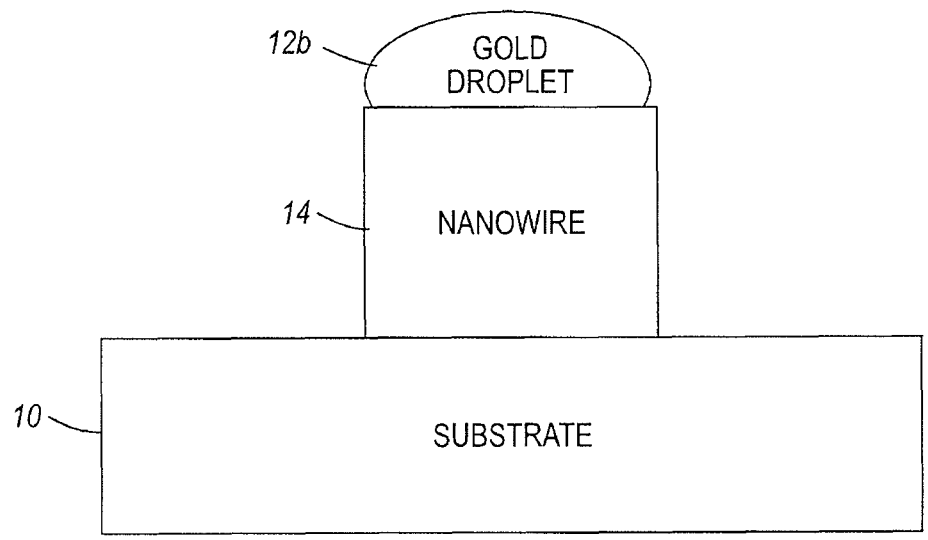
FIG. 7A illustrates a cross-sectional view of a nanowire grown on the substrate.
Figure 7B:
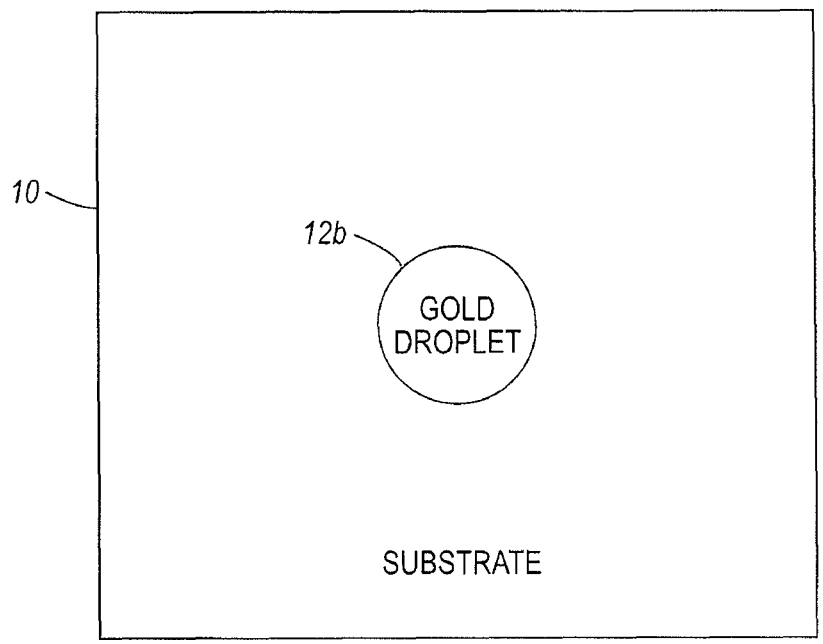
FIG. 7B illustrates a topside view of the gold droplet on the substrate in accordance with certain embodiments of the disclosed technology.

FIG. 7A illustrates a cross-sectional view of a nanowire 14 grown on the substrate 10 in accordance with certain embodiments of the disclosed technology. FIG. 7B illustrates a topside view of the gold droplet 12*b* on the substrate 10. The sample illustrated in FIGS. 7A and 7B may correspond to a sample resulting from the step at 110 of FIG. 1, for example. As noted above, nanowires can generally be made from any of germanium, several III-V semiconductors, and various oxides. Other materials that can be grown as nanowires from a catalyst may be used in place of or in addition to the noted materials.

Figure 8:
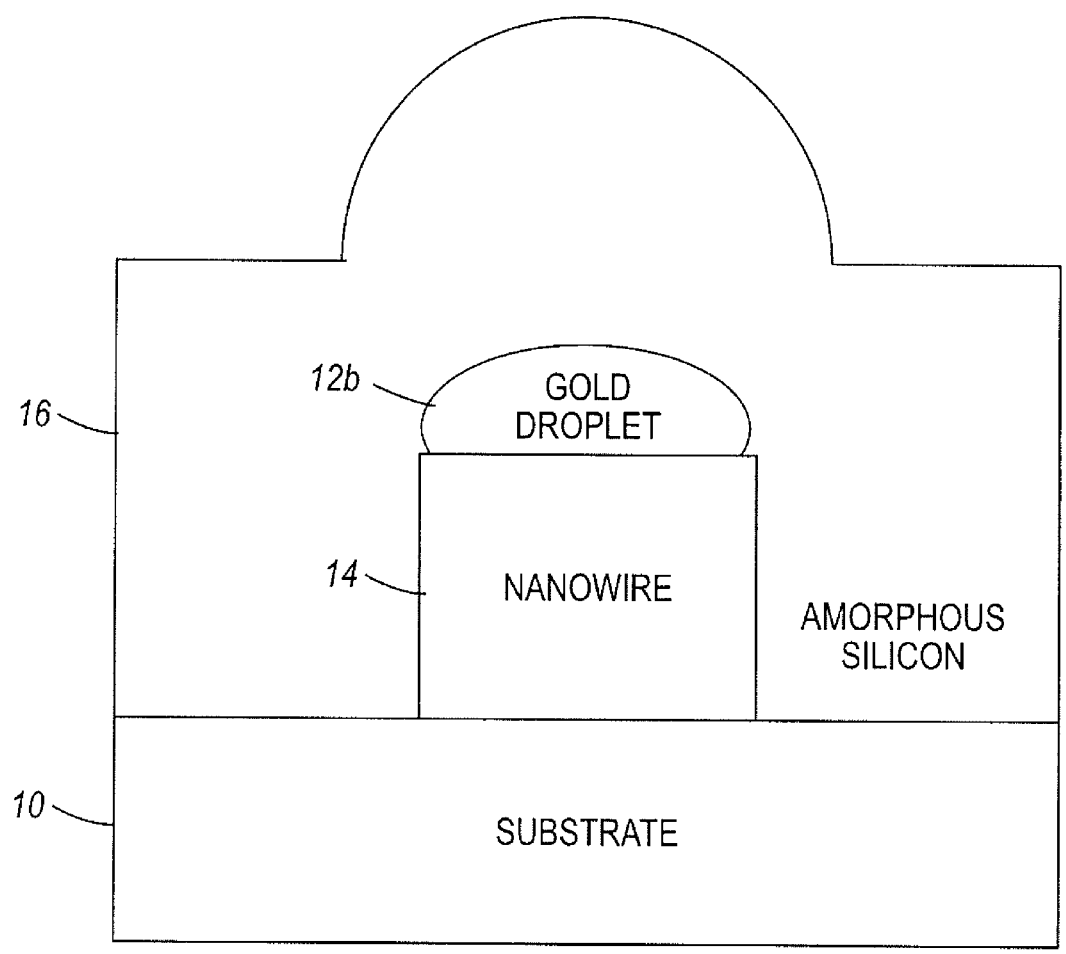
FIG. 8 illustrates a cross-sectional view of a thin film of amorphous silicon deposited on the substrate in accordance with certain embodiments of the disclosed technology.

FIG. 8 illustrates a cross-sectional view of a thin film of amorphous silicon 16 deposited on the substrate 10 in accordance with certain embodiments of the disclosed technology. The sample illustrated in FIG. 8 may correspond to a sample resulting from the step at 112 of FIG. 1, for example. As is readily apparent from the figure, the amorphous silicon 16 also coats the gold droplet 12*b* and nanowire 14 on the substrate 10.

Figure 9A:
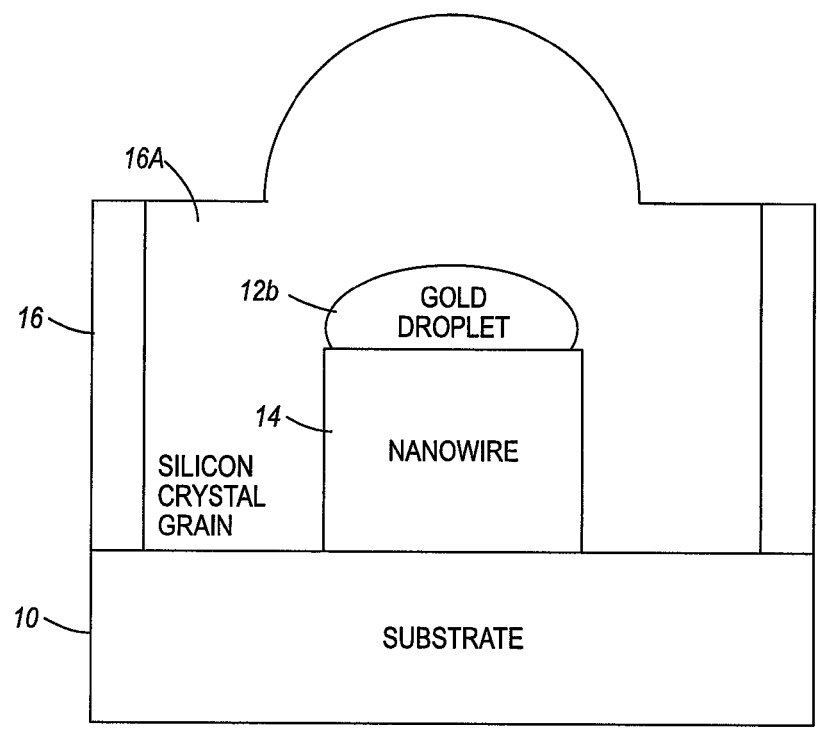
FIG. 9A illustrates a cross-sectional view of the formation of a silicon crystal grain within the amorphous silicon on the substrate, gold droplet, and nanowire on the substrate.
Figure 9B:
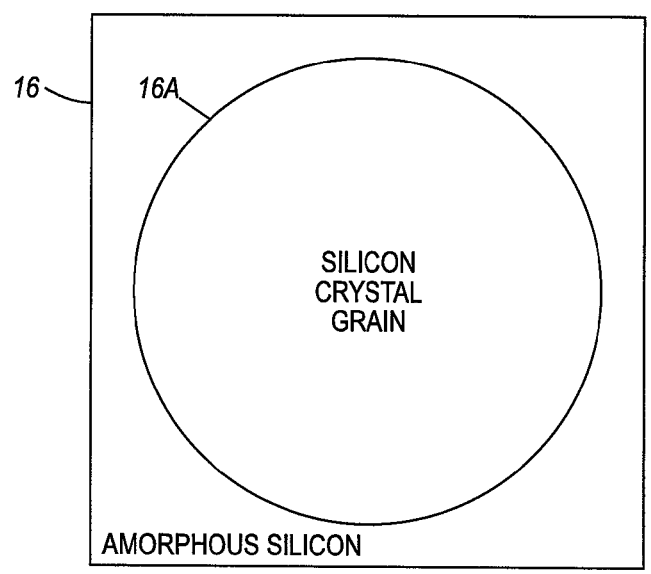
FIG. 9B illustrates a topside view of the silicon crystal grain within the amorphous silicon on the substrate in accordance with certain embodiments of the disclosed technology.

FIG. 9A illustrates a cross-sectional view of the formation of a silicon crystal grain 16A within the amorphous silicon 16 on the substrate 10, gold droplet 12*b*, and nanowire 14 in accordance with certain embodiments of the disclosed technology. FIG. 9B illustrates a topside view of the silicon crystal grain 16A within the amorphous silicon 16 on the substrate 10. The sample illustrated in FIGS. 9A and 9B may correspond to a sample resulting from the step at 116 of FIG. 1, for example.

Figure 10A:
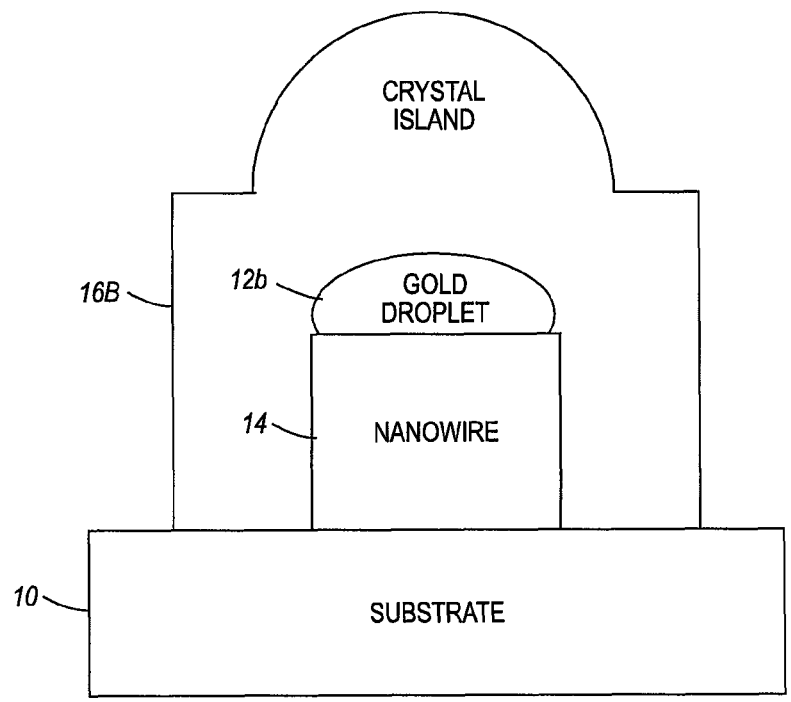
FIG. 10A illustrates a cross-sectional view of a crystal island resulting from a stripping of unwanted silicon and silicon crystal grain on the substrate.
Figure 10B:
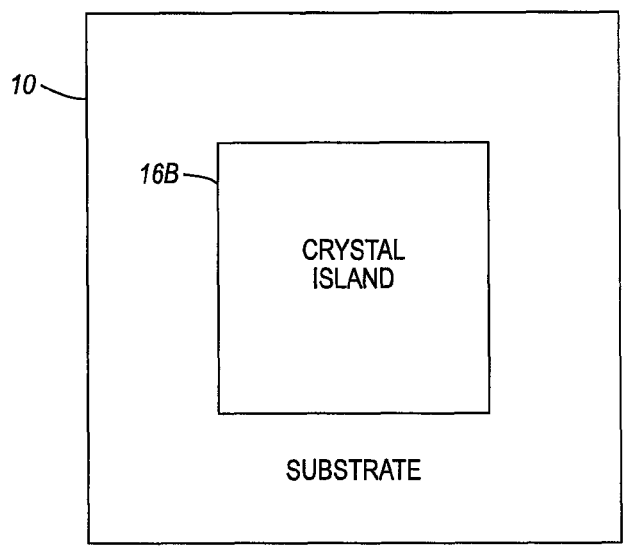
FIG. 10B illustrates a topside view of the resulting crystal island on the substrate in accordance with certain embodiments of the disclosed technology.

FIG. 10 illustrates a cross-sectional view of a crystal island 16B resulting from a stripping of unwanted silicon 16 and silicon crystal grain 16A on the substrate 10 in accordance with certain embodiments of the disclosed technology. FIG. 10B illustrates a topside view of the resulting crystal island 16B on the substrate 10. The sample illustrated in FIGS. 10A and 10B may correspond to a sample resulting from the step at 118 of FIG. 1, for example.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method, comprising:
   depositing a thin metal film on a substrate of a sample;
   establishing a metal island on the substrate by patterning the thin metal film on the substrate;
   annealing the sample to de-wet the metal island and form a metal droplet from the metal island;
   growing a nanowire on the substrate using the metal droplet as a catalyst, wherein the nanowire comprises a first semiconductor material;
   depositing a thin film of a second semiconductor material on the sample;
   annealing the sample to allow for lateral crystallization to form a crystal grain;
   patterning the crystal grain to establish a crystal island; and
   processing an electronic device using the crystal island.

2. The method of claim 1, wherein the metal comprises one of a group consisting of: gold, copper, and nickel, wherein the first semiconductor material comprises one of a group consisting of: silicon (Si), gallium nitride (GaN), and gallium arsenide (GaAs), and wherein the second semiconductor material comprises one of a group consisting of: Si, GaN, and GaAs.

3. The method of claim 1, further comprising performing a light etching to remove any portion of the metal island that did not re-wet.

4. The method of claim 1, further comprising depositing a silicon oxide overcoat on the sample subsequent to the depositing of the thin film of the second semiconductor material on the sample.

5. The method of claim 1, further comprising stripping unwanted silicon subsequent to the patterning of the crystal grain.

6. The method of claim 1, wherein depositing the thin film of the second semiconductor material is performed at a time subsequent to depositing the thin metal film on the substrate.

7. The method of claim 1, wherein the thin metal film has a thickness of no more than approximately 5 nanometers.

8. The method of claim 1, wherein the metal droplet has a diameter of no more than approximately 200 nanometers.

9. The method of claim 1, wherein the electronic device comprises a thin film transistor (TFT).

10. The method of claim 1, wherein growing the nanowire comprises using vapor-liquid-solid (VLS) techniques or vapor-solid-solid (VSS) techniques.

11. A method, comprising:
depositing a thin film of a first semiconductor material on a sample;
depositing a thin metal film on the sample;
establishing a metal island on the sample by patterning the thin metal film;
annealing the sample to de-wet the metal island and form a metal droplet from the metal island;
growing a nanowire on the substrate using the metal droplet as a catalyst, wherein the nanowire comprises a second semiconductor material;
annealing the sample to allow for lateral crystallization to form a crystal grain;
patterning the crystal grain to establish a crystal island; and
processing an electronic device using the crystal island.

12. The method of claim 11, wherein the metal comprises one of a group consisting of: gold, copper, and nickel, wherein the first semiconductor material comprises one of a group consisting of: silicon (Si), gallium nitride (GaN), and gallium arsenide (GaAs), and wherein the second semiconductor material comprises one of a group consisting of: Si, GaN, and GaAs.

13. The method of claim 11, further comprising performing a light etching to remove any portion of the metal island that did not re-wet.

14. The method of claim 11, further comprising depositing a silicon oxide overcoat on the sample subsequent to the growing of the nanowire.

15. The method of claim 11, wherein the thin metal film has a thickness of no more than approximately 5 nanometers.

16. The method of claim 11, wherein the metal droplet has a diameter of no more than approximately 200 nanometers.

17. The method of claim 11, wherein growing the nanowire comprises using vapor-liquid-solid (VLS) techniques or vapor-solid-solid (VSS) techniques.

18. A method, comprising:
depositing a thin metal film on a substrate of a sample;
establishing a metal island on the substrate by patterning the thin metal film on the substrate;
annealing the sample to de-wet the metal island and form a metal droplet from the metal island;
growing a nanowire on the substrate using the metal droplet as a catalyst, wherein the nanowire comprise a first semiconductor material;
depositing a thin film of a second semiconductor material on the sample;
patterning the thin film of the second semiconductor material to establish a crystal island;
annealing the sample to allow for lateral crystallization to form the crystal island as a crystal grain; and
processing an electronic device using the crystal island.

19. The method of claim 18, wherein the metal comprises one of a group consisting of: gold, copper, and nickel, wherein the first semiconductor material comprises one of a group consisting of: silicon (Si), gallium nitride (GaN), and gallium arsenide (GaAs), and wherein the second semiconductor material comprises one of a group consisting of: Si, GaN, and GaAs.

20. The method of claim 18, further comprising performing a light etching to remove any portion of the metal island that did not re-wet.

21. The method of claim 18, further comprising depositing a silicon oxide overcoat on the sample subsequent to the depositing of the thin film of the second semiconductor material on the sample.

22. The method of claim 18, wherein the thin metal film has a thickness of no more than approximately 5 nanometers.

23. The method of claim 18, wherein the metal droplet has a diameter of no more than approximately 200 nanometers.

24. The method of claim 18, wherein growing the nanowire comprises using vapor-liquid-solid (VLS) techniques or vapor-solid-solid (VSS) techniques.

* * * * *